United States Patent
Zhu et al.

(10) Patent No.: US 9,954,497 B2
(45) Date of Patent: Apr. 24, 2018

(54) CIRCUITS FOR LOW NOISE AMPLIFIERS WITH INTERFERER REFLECTING LOOPS

(71) Applicant: The Trustees of Columbia University in the City of New York, New York, NY (US)

(72) Inventors: Jianxun Zhu, New York, NY (US); Peter R. Kinget, Summit, NJ (US); Harish Krishnaswamy, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 15/117,662

(22) PCT Filed: Feb. 9, 2015

(86) PCT No.: PCT/US2015/015036
§ 371 (c)(1),
(2) Date: Aug. 9, 2016

(87) PCT Pub. No.: WO2015/163971
PCT Pub. Date: Oct. 29, 2015

(65) Prior Publication Data
US 2016/0359459 A1   Dec. 8, 2016

Related U.S. Application Data

(60) Provisional application No. 61/937,594, filed on Feb. 9, 2014.

(51) Int. Cl.
*H03F 1/34* (2006.01)
*H03F 1/22* (2006.01)
(Continued)

(52) U.S. Cl.
CPC ............. *H03F 1/342* (2013.01); *H03F 1/223* (2013.01); *H03F 3/193* (2013.01); *H03F 3/211* (2013.01);
(Continued)

(58) Field of Classification Search
CPC ........................................................ H03F 1/34
(Continued)

(56) References Cited

U.S. PATENT DOCUMENTS 5,001,441 A * 3/1991 Gen-Kuong ....... H03H 11/0433
330/107
7,266,360 B2   9/2007 Kang et al.
(Continued)

OTHER PUBLICATIONS

Andrews, C. and Molnar, A., "A Passive Mixer-First Receiver With Digitally Controlled and Widely Tunable RF Interface", in IEEE Journal of Solid-State Circuits, vol. 45, No. 12, Dec. 2010, pp. 2696-2708.

(Continued)

*Primary Examiner* — Henry Choe
(74) *Attorney, Agent, or Firm* — Byrne Poh LLP

(57) ABSTRACT

Circuits for low noise amplifiers with interferer reflecting loops are provided. In some embodiments, circuits for a low noise amplifier with an interferer reflecting loop are provided, the circuits comprising: a low noise amplifier (LNA) having an input and an output; a buffer having an input coupled to the output of the LNA and an output; and notch filter having an input coupled to the output of the buffer and an output coupled to the input of the LNA.

30 Claims, 7 Drawing Sheets

(51) Int. Cl.
H03F 3/21 (2006.01)
H03F 3/45 (2006.01)
H03F 3/72 (2006.01)
H03F 3/193 (2006.01)

(52) U.S. Cl.
CPC ..... H03F 3/45179 (2013.01); H03F 3/45645 (2013.01); H03F 3/72 (2013.01); H03F 2200/06 (2013.01); H03F 2200/09 (2013.01); H03F 2200/168 (2013.01); H03F 2200/294 (2013.01); H03F 2200/411 (2013.01); H03F 2200/78 (2013.01); H03F 2203/45311 (2013.01); H03F 2203/45418 (2013.01); H03F 2203/45424 (2013.01); H03F 2203/45512 (2013.01)

(58) Field of Classification Search
USPC .................................. 330/293, 294, 75, 291
See application file for complete search history.

(56) References Cited

U.S. PATENT DOCUMENTS

| | | | |
|---|---|---|---|
| 7,787,852 B2 | 8/2010 | Rofougaran | |
| 8,166,084 B2 | 4/2012 | Hahn et al. | |
| 8,571,504 B2 * | 10/2013 | Robert | H03F 1/34 455/200.1 |
| 8,594,603 B2 | 11/2013 | Balankutty et al. | |
| 9,065,504 B2 * | 6/2015 | Kwon | H04B 1/0475 |
| 2006/0103362 A1 * | 5/2006 | Eberlein | H03M 1/50 323/282 |
| 2008/0214139 A1 | 9/2008 | Conta et al. | |
| 2009/0066446 A1 * | 3/2009 | Sahu | H03L 7/093 333/172 |
| 2009/0267655 A1 * | 10/2009 | Chen | G09G 3/3696 327/108 |
| 2011/0221518 A1 * | 9/2011 | Romero | H03H 19/004 327/554 |
| 2012/0249234 A1 | 10/2012 | Robert et al. | |
| 2012/0252394 A1 | 10/2012 | Balakrishnan et al. | |
| 2013/0149983 A1 | 6/2013 | Fahim et al. | |

OTHER PUBLICATIONS

Andrews, C. and Molnar, A., "A Passive-Mixer-First Receiver with Baseband-Controlled RF Impedance Matching, 6dB NF, and 27dBm Wideband IIP3", in IEEE International Solid-State Circuits Conference (ISSCC) Digest of Technical Papers, San Francisco, CA, US, Feb. 7-11, 2010, pp. 46-47.
Aparin, V. et al., "An Integrated LMS Adaptive Filter of TX Leakage for CDMA Receiver Front Ends", in IEEE Journal of Solid-State Circuits, vol. 41, No. 5, May 2006, pp. 1171-1182.
Aparin, V., "A New Method of TX Leakage Cancellation in W/CDMA and GPS receivers", in IEEE Radio Frequency Integrated Circuits Symposium (RFIC) Digest of Technical Papers, Atlanta, GA, US, Jun. 15-17, 2008, pp. 87-90.
Ayazian, S. and Gharpurey, R., "Feedforward Interference Cancellation in Radio Receiver Front-ends", in IEEE Transactions Circuits and Systems II: Express Briefs, vol. 54, No. 10, Nov. 2007, pp. 902-906.
Balankutty, A. and Kinget, P., "An Ultra-low Voltage, Low-noise, High Linearity 900-MHz Receiver with Digitally Calibrated In-band Feed-forward Interferer Cancellation in 65-nm CMOS", in IEEE Journal of Solid-State Circuits, vol. 46, No. 10, Oct. 2011, pp. 2268-2283.
Blaakmeer, S. et al., "Wideband Balun-LNA With Simultaneous Output Balancing, Noise-Canceling and Distortion-Canceling", in IEEE Journal of Solid-State Circuits, Jun. 2008, vol. 43, No. 6, Jun. 2008, pp. 1341-1350.

Borremans, J. et al. "Low-area Active-feedback Low-noise Amplifier Design in Scaled Digital CMOS", in IEEE Journal of Solid-State Circuits, vol. 43, No. 11, Nov. 2008, pp. 2422-2433.
Chen, R. and Hashemi, H., "A 0.5-to-3 GHz Software-Defined Radio Receiver using Sample Domain Signal Processing", In IEEE Radio Frequency Integrated Circuits Symposium (RFIC), Seattle, WA, US, Jun. 2-4, 2013, pp. 315-318.
Cherry, E. and Hooper, D., "The Design of Wide-Band Transistor Feedback Amplifiers", in Proceedings of the Institution of Electrical Engineers, vol. 110, No. 2, Feb. 1963, pp. 375-389.
Darabi, H. et al., "Highly Integrated and Tunable RF Front Ends for Reconfigurable Multiband Transceivers: A Tutorial", in IEEE Transactions on Circuits and Systems I: Regular Papers , vol. 58, No. 9, Sep. 2011, pp. 2038-2050.
Darabi, H., "A Blocker Filtering Technique for SAW-Less Wireless Receivers", in IEEE Journal of Solid-State Circuits, vol. 42, No. 12, Dec. 2007, pp. 2766-2773.
Darvishi, M. et al., "A 0.1-to-1.2GHz Tunable 6th-Order N-Path Channel-Select Filter with 0.6dB Passband Ripple and +7dBm Blocker Tolerance", in Papers IEEE International Solid-State Circuits Conference (ISSCC) Digest of Technical, San Francisco, CA, US, Feb. 17-21, 2013, pp. 172-173.
Der Perre, L.V. et al., "Green Software Defined Radios", Springer, New York, NY, US, Oct. 28, 2010, pp. 1-157.
Fong, K.L., "Dual-band High-linearity Variable-gain Low-noise Amplifiers for Wireless Applications", in IEEE International Solid-Stale Circuits Conference (ISSCC) Digest of Technical Papers, Feb. 1999, pp. 224-225.
Geis, A. et al., "A 0.045mm2 0.1-6GHz Reconfigurable Multi-Band, Multi-Gain LNA for SDR", in IEEE Radio Frequency Integrated Circuits Symposium (RFIC), Anaheim, CA, US, May 23-25, 2010, pp. 123-126.
Ghaffari, A. et al., "8-Path Tunable RF Notch Filters for Blocker Suppression", In IEEE International Solid-Slate Circuits Conference (ISSCC) Digest of Technical Papers , San Francisco, CA, US, Feb. 19-23, 2012, pp. 76-78.
Ghaffari, A. et al., "Tunable High-Q N-Path Band-Pass Filters: Modeling and Verification", in IEEE Journal of Solid-State Circuits, vol. 46, No. 5, May 2011, pp. 998-1010.
Ghaffari, A. et al., "Tunable N-path Notch Filters for Blocker Suppression: Modeling and Verification", in IEEE Journal of Solid-State Circuits, vol. 48, No. 6, Jun. 2013, pp. 1370-1382.
Giannini, V. et al., "A 2-mm 0.1-5 GHz Software-defined Radio Receiver in 45-nm Digital CMOS", in IEEE Journal of Solid-State Circuits, vol. 44, No. 12, Dec. 2009, pp. 3486-3498.
Han, H.G. and Kim, T.W., "A CMOS RF Programmable-Gain Amplifier for Digital TV With a + 9-dBm IIP3 Cross-Coupled Common-Gate LNA", in IEEE Transactions on Circuits and Systems II: Express Briefs , vol. 59, No. 9, Sep. 2012, pp. 543-547.
He, X. and Kundur, H., "A Compact SAW-less Multiband WCDMA/GPS Receiver Front-End with Translational Loop for Input Matching", in IEEE International Solid-State Circuits Conference (ISSCC) Digest of Technical Papers, Feb. 20-24, 2011, pp. 372-374.
International Preliminary Report on Patentability of the International Searching Authority dated Aug. 9, 2016 in International Patent Application No. PCT/US2015/015036.
International Search Report and Written Opinion of the International Searching Authority dated Oct. 23, 2015 in International Patent Application No. PCT/US2015/015036.
Izquierdo, C. et al., "Reconfigurable Wide-band Receiver with Positive Feed-back Translational Loop", in IEEE Radio Frequency Integrated Circuits Symposium (RFIC), Baltimore, MD, US, Jun. 5-7, 2011, pp. 1-4.
Izquierdo, C. et al., "Wide-band Receiver Architecture with Flexible Blocker Filtering Techniques", in IEEE International Conference on Electronics, Circuits, Systems (ICECS), Athens, GR, Dec. 12-15, 2010, pp. 894-897.
Kaltiokallio, M. et al., "Wideband 2 to 6 GHz RF Front-end with Blocker Filtering", in IEEE Journal Solid-State Circuits, vol. 47, No. 7, Jul. 2012, pp. 1636-1645.

(56) References Cited

OTHER PUBLICATIONS

Mirzaei, A. et al., "A 65 nm CMOS Quad-band SAW-less Receiver SoC for GSM/GPRS/EDGE", in IEEE Journal of Solid-State Circuits, vol. 46, No. 4, Apr. 2011, pp. 950-964.

Murphy, D. et al., "A Blocker-tolerant, Noise-cancelling Receiver Suitable for Wideband Wireless Applications", in IEEE Journal of Solid-State Circuits, vol. 47, No. 12, Dec. 12, 2012, pp. 2943-2963.

Park, J.W. and Razavi, B., "A 20 mW GSM/WCDMA Receiver with RF Channel Selection", in IEEE International Solid-State Circuits Conference Digest of Technical Papers (ISSCC), San Francisco, CA, US, Feb. 9-14, 2014, pp. 356-357.

Pozar, D.M., "Microwave Engineering", 3rd Edition, Wiley & Sons Inc., New York, NY, US, Feb. 5, 2004, pp. 1-752.

Razavi, B., "RF Microelectronics", 2nd Edition, Prentice Hall, Upper Saddle River, NJ, US, Sep. 22, 2011, pp. 1-960.

Sen, S. et al., "A Power-Scalable Channel-Adaptive Wireless Receiver Based on Built-In Orthogonally Tunable LNA", in Transactions on Circuits and Systems I: Regular Papers, vol. 59, No. 5, May 3, 2012, pp. 946-957.

Steyaert, M. and Craninckx, J., "1.1 GHz Oscillator Using Bondwire Inductance", in Electronics Letters, vol. 30, No. 3, Feb. 3, 1994, pp. 244-245.

Strum, J. et al., "A 65nm CMOS Wide-band LNA with Continuously Tunable Gain from 0dB to 24dB", in Proceedings of IEEE International Symposium on Circuits and Systems (ISCAS), Beijing, CN, May 19-23, 2013, pp. 733-736.

Wang, Y.H. et al., "A 2.1 to 6 GHz Tunable-band LNA With Adaptive Frequency Responses by Transistor Size Scaling", in IEEE Microwave and Wireless Components Letters, vol. 20, No. 6, Jun. 2010, pp. 346-348.

Werth, T. et al., "Active Feedback Interference Cancellation in RF Receiver Front-End", in IEEE Radio Frequency Integrated Circuits Symposium (RFIC), Boston, MA, US, Boston, MA, US, Jun. 7-9, 2009, pp. 379-382.

Werth, T. et al., "An Active Feedback Interference Cancellation Technique for Blocker Filtering in RF Receiver Front-Ends", in IEEE Journal of Solid-State Circuits, vol. 45, No. 5, May 2010, pp. 989-997.

Youssef, S. et al., "Active Feedback Receiver with Integrated Tunable RF Channel Selectivity, Distortion Cancelling, 48dB Stopband Rejection and .+12Bm Wideband IIP3, Occupying 0.06mm2 in 65nm CMOS", in IEEE Int. Solid-State Circuits Conference (ISSCC) San Francisco, CA, US, Feb. 19-23, 2012, pp. 166-168.

Zhang, H. and Sanchez-Sinencio, E., "Linearization Techniques for CMOS Low Noise Amplifiers: A Tutorial", in IEEE Transactions on Circuits and Systems I: Regular Papers, Jan. 2011, vol. 58, No. 1, pp. 22-36.

Zhuo, W. et al., "Using Capacitive Cross-coupling Technique in RF Low Noise Amplifiers and Down-conversion Mixer Design", in Proceedings of the European Solid-State Circuits Conference (ESSCIRC), Stockholm, SE, Sep. 19-21, 2000, pp. 77-80.

\* cited by examiner

CIRCUITS FOR LOW NOISE AMPLIFIERS WITH INTERFERER REFLECTING LOOPS

CROSS REFERENCE TO RELATED APPLICATION

This application claims the benefit of U.S. Provisional Patent Application No. 61/937,594, filed Feb. 9, 2014, which is hereby incorporated by reference herein in its entirety.

STATEMENT REGARDING GOVERNMENT FUNDED RESEARCH

This invention was made with government support under contract HR0011-12-1-0006 by the Defense Advanced Research Projects Agency (DARPA). The government has certain rights in the invention.

BACKGROUND

The growth of wireless communications has resulted in a large number of different standards operating in different portions of the spectrum. Software defined radios (SDRs) have been proposed so a single device can operate with different standards or frequencies. Their implementation remains an active area of research given the challenging performance requirements in terms of noise figure (NF), linearity, and power dissipation. Multi-standard receivers are often designed to meet the worst-case combination of requirements which leads to increased power dissipation. Given the continued growth in usage and data rates of wireless devices, the amount of interference that receivers need to tolerate keeps increasing, while the spectral conditions can also vary significantly from location to location and from time to time. Therefore it is becoming more and more desirable to design radio frequency (RF) front ends that can dynamically adjust to the specific spectral operating conditions and standards.

Accordingly, new circuits for radio receivers are desirable.

SUMMARY

In accordance with some embodiments, circuits for low noise amplifiers with interferer reflecting loops are provided. In some embodiments, circuits for a low noise amplifier with an interferer reflecting loop are provided, the circuits comprising: a low noise amplifier (LNA) having an input and an output; a buffer having an input coupled to the output of the LNA and an output; and notch filter having an input coupled to the output of the buffer and an output coupled to the input of the LNA

DETAILED DESCRIPTION

In accordance with some embodiments, circuits for low noise amplifiers with interferer reflecting loops are provided. These circuits can provide receiver components that can amplify desired in-band signals while reflecting out-of-band signals back to the signal source (e.g., one or more antennas).

Figure 1:
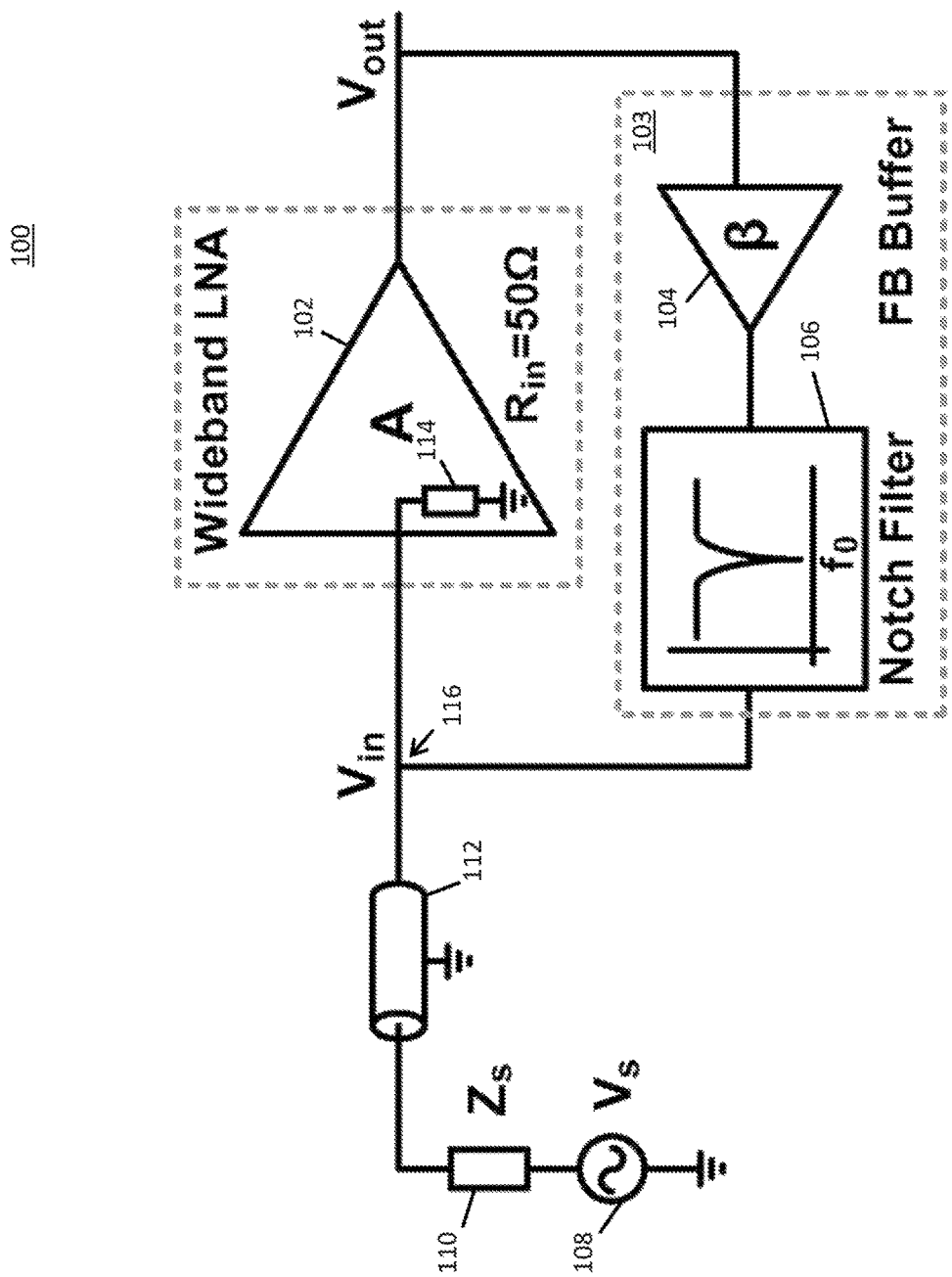
FIG. 1 is a block diagram of a low noise amplifier with an interferer reflecting loop in accordance with some embodiments.

Turning to FIG. 1, an example 100 of a circuit for a low noise amplifier with an interferer reflecting loop is illustrated. As shown, circuit 100 includes a low noise amplifier (LNA) 102, an interferer reflecting loop 103, a signal source $V_S$ 108, a source impedance $Z_S$ 110, and a transmission line 112.

LNA 102 can be any suitable LNA, such as a wideband LNA, and may have an input impedance $R_{in}$ 114, which can have any suitable value, such as an impedance equal to that of source impedance $Z_S$, in some embodiments. Interferer reflecting loop 103 can include a feedback buffer 104 (which can be any suitable RF signal buffer in some embodiments) and a notch filter 106 (which can be any suitable notch filter in some embodiments). Signal source 108 can be any suitable source of a signal to be amplified by LNA 102. For example, in some embodiments, signal source 108 can be one or more antennas the provide RF signals. Source impedance $Z_S$ 110 can be any suitable source impedance and may be part of signal source 108 in some embodiments. For example, source impedance $Z_S$ 110 may be the impedance of one or more antennas. Transmission line 112 can be any suitable transmission line, such as a coaxial cable, or combination of transmission lines, and can have any suitable characteristics, in some embodiments. For example, transmission line 112 can have a characteristic impedance equal to that of $Z_S$ in some embodiments.

During operation of circuit 100, for in-band signals (which can be those signals at or around a desired receiver frequency) received at $V_{in}$, the loop gain resulting from feedback loop 103 can be small and therefore the presence of the feedback loop can be ignored. Under such conditions, the input impedance at $V_{in}$ is generally set by the LNA input impedance ($R_{in}$), which can be matched to the source impedance ($Z_S$).

For out-of-band interferers (which can be those signals not at or around a desired receiver frequency), however, the gain from feedback loop 103 can be large and therefore the feedback loop can alter the input impedance at $V_{in}$. Under such conditions, the input impedance $V_{in}$ is reduced below that of $R_{in}$ and $Z_S$ and hence low impedance signal reflection of the out-of-band interferers occurs.

To the first order, the voltage swings at the LNA input are dominated by the in-band signals. Out-of-band signals are shorted through the notch filter and its low impedance driver and the interferer power is reflected back to source 108 (e.g., the antenna(s)).

Figure 2:
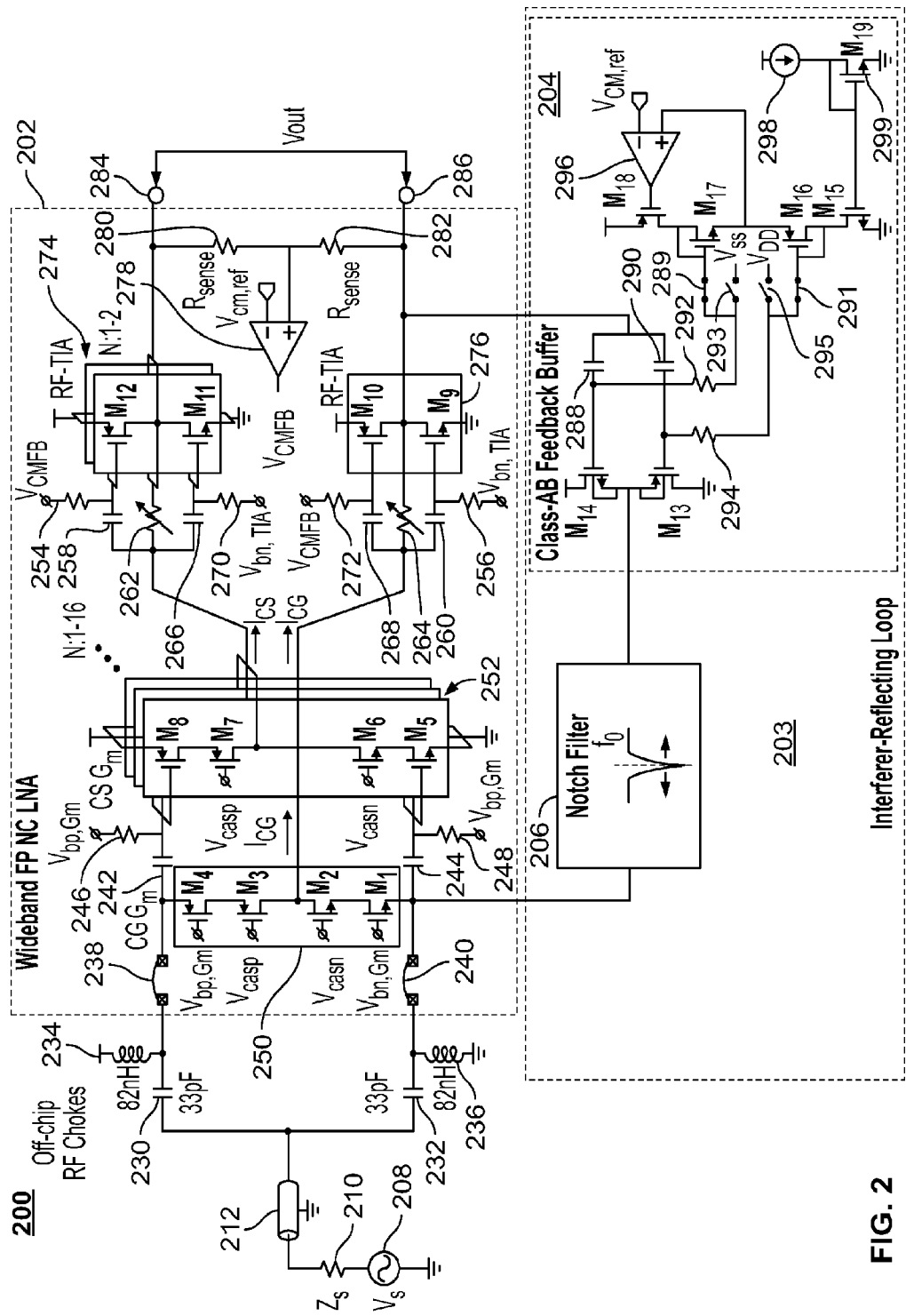
FIG. 2 is a schematic diagram of a low noise amplifier with an interferer reflecting loop in accordance with some embodiments.

FIG. 2 shows a detailed schematic of an example 200 of a circuit including a low noise amplifier 202 with an interferer reflecting loop 203. As in circuit 100, circuit 200 also includes a signal source $V_S$ 208, a source impedance $Z_S$ 210, and a transmission line 212, which are substantially similar to signal source $V_S$ 108, source impedance $Z_S$ 110, and transmission line 112 in FIG. 1. Circuit 200 further includes DC blocking capacitors 230 and 232 (which can have any suitable values, such as 33 pF, in some embodiments) and RF chokes 234 and 236 (which can have any suitable values, such as 82 nH, in some embodiments).

Within a device package including LNA 202, bondwires 238 and 240 may be provided to connect pins of the device package to a semiconductor chip on which the LNA is implemented.

As shown in FIG. 2, common gate transconductor 250 can be provided within LNA 202 in some embodiments. Transconductor 250 can be formed from transistors M1, M2, M3, and M4 in the configuration shown. $V_{bp,Gm}$ and $V_{bn,Gm}$ are bias voltages that can be supplied to the transconductor and can have any suitable values. $V_{casp}$ and $V_{casn}$ are control signals for turning transconductor 250 off by pulling $V_{casn}$ to $V_{SS}$ and $V_{casp}$ to $V_{DD}$.

A common source transconductor 252 can also be provided within LNA 202 in some embodiments. As illustrated, in some embodiments, transconductor 252 can be a multi-slice transconductor having any suitable number of slices, such as 16 slices as shown in FIG. 2. In some embodiments, these slices can be individually turned off by pulling the respective $V_{casn}$ to $V_{SS}$ and $V_{casp}$ to $V_{DD}$. Turning off slices allows power consumption by the LNA to be reduced in the field at the expense of a higher noise factor. As shown, each slice of the common source transconductor can include transistors M5, M6, M7, and M8 connected as shown.

Although not shown in FIG. 2, in some embodiments, common gate transconductor 250 can be implemented as a multi-slice transconductor having any suitable number of switchable slices in a manner similar to transconductor 252.

DC blocking capacitors 242 and 244 and shunt resistors 246 and 248 are also provided at the inputs to the common source transconductor to provide proper bias voltages.

In some embodiments, the signal currents $I_{CG}$ and $I_{CS}$ from common gate transconductor 250 and common source transconductor 252, respectively, are pushed into radio-frequency trans-impedance amplifiers (RF-TIAs) 276 and 274, respectively. RF-TIA 274 can be formed from any suitable number of switchable slices (such as two slices as shown in FIG. 2) and each slice can include transistors M11 and M12 connected as shown in FIG. 2, in some embodiments. To make the slices of RF-TIA switchable, switches (not shown) can be provided at the gates of transistors M11 and M12 that break them away from the signal path and pull them to $V_{SS}$ and $V_{DD}$ respectively. RF-TIA 276 can include transistors M9 and M10 connected as shown in FIG. 2, in some embodiments. Although not shown in FIG. 2, in some embodiments, RF-TIA 276 can be implemented as a multi-slice RF-TIA having any suitable number of switchable slices in a manner similar to RF-TIA 274.

DC blocking capacitors 258, 266, 268, and 260 can be provided at the inputs to RF-TIAs 274 and 276.

In some embodiments, the RF-TIAs can include resistive shunt-shunt feedback with digitally programmable resistors. More particularly, as shown, a feedback mechanism can be formed from digitally programmable resistors 262 and 264 and transistor slices 274 and 276. Sense resistors 280 and 282, shunt resistors 254, 270, 272, and 256, and operational amplifier 278 set the common-mode voltage at output nodes 284 and 286 to the desired value of $V_{CM,ref}$. This feedback mechanism allows one to independently program the gain of LNA 202 in the field and to adjust the weighted combination of the common source signals (from RF-TIAs 274) and the common gate signals (from RF-TIA 276) at output nodes 284 and 286 in the field.

Like interferer reflecting loop 103 described above in connection with FIG. 1, interferer reflecting loop 203 of FIG. 2 includes a feedback buffer 204 and a notch filter 206.

Feedback buffer 204 can be implemented using a class-AB complementary source follower including transistors M13 and M14 in some embodiments. Using a source follower topology can provide a low output impedance in some embodiments. The complementary structure can be biased by a bias circuit (e.g., as described below) with a low quiescent current (e.g., 1.1 mA) to save DC power, but when large out-of-band signals are present, the feedback buffer can sink large currents through the notch filter from source 208. To minimize the body effect, triple-well transistors can be used for transistors M13 and M14.

DC blocking capacitors 288 and 290 can be provided at the gates of transistors M14 and M13, respectively.

A bias circuit can be provided in buffer 204 using operational amplifier 296, current source 298, transistor 299, transistors M15, M16, M17, and M18, and resistors 292 and 294. In the bias circuit, the signal transistors are replicated as diodes (M16 and M17) while the DC bias current and the DC voltage at the sources of M16 and M17 can be controlled to $V_{CM,ref}$ with a feedback loop formed by M17, M18 and operational amplifier 296. Matching between M13, M16, M14, and M17 keep the DC output voltage of buffer 204 close to $V_{CM,ref}$.

In some embodiments, the user can disable the IR loop around the LNA by putting the feedback buffer in a high impedance state by appropriately pulling the gate biases of transistors M14 and M13 to $V_{SS}$ and $V_{DD}$, respectively, by opening switches 289 and 291 and closing switches 293 and 295.

Any suitable parameters can be used for the components of FIG. 2 in some embodiments. For example, in some embodiments, the parameters in the following tables can be used:

| MOSFETs | W(μm) | L(μm) |
|---|---|---|
| M1 | 32 | 0.08 |
| M2 | 32 | 0.08 |
| M3 | 64 | 0.08 |
| M4 | 64 | 0.08 |
| M5 | 16 | 0.08 |
| M6 | 16 | 0.08 |
| M7 | 32 | 0.08 |
| M8 | 32 | 0.08 |
| M9 | 48 | 0.08 |
| M10 | 96 | 0.08 |
| M11 | 48 | 0.08 |
| M12 | 96 | 0.08 |
| M13 | 80 | 0.08 |
| M14 | 40 | 0.08 |
| M15 | 8 | 0.5 |
| M16 | 8 | 0.08 |
| M17 | 4 | 0.08 |
| M18 | 16 | 0.5 |
| M19(299) | 8 | 0.5 |

| Resistors | R (kΩ) |
|---|---|
| 246 | 28 |
| 248 | 28 |

-continued

| Resistors | R (kΩ) |
|---|---|
| 254 | 60 |
| 262 | 0.05-2.4 |
| 270 | 60 |
| 272 | 60 |
| 264 | 0.16-2.4 |
| 256 | 60 |
| 280 | 15.5 |
| 282 | 15.5 |

| Capacitors | C (pF) |
|---|---|
| 242 | 2 |
| 244 | 2 |
| 258 | 1.3 |
| 266 | 1.3 |
| 268 | 1.3 |
| 260 | 1.3 |
| 288 | 1.3 |
| 290 | 1.3 |

| Current Source | I(µA) |
|---|---|
| 298 | 50 |

In accordance with some embodiments, any suitable notch filter can be used for notch filter 206 of FIG. 2. For example, in some embodiments, the notch filter can be implemented using: a switched-capacitor N-path notch filter; an LC filter with on-chip switchable capacitors and a spiral inductor; or an LC filter with on-chip switchable capacitors with bondwires as high Q inductors.

Figure 3:
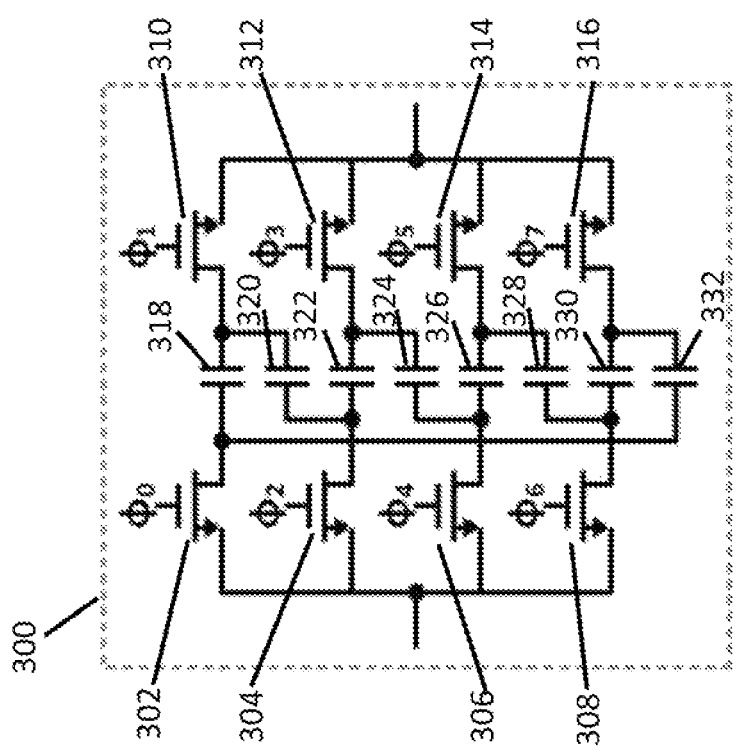
FIG. 3 is a schematic diagram of a notch filter that can be used with the interferer reflecting loop of FIG. 2 in accordance with some embodiments.

Turning to FIG. 3, an example of a circuit 300 for implementing a notch filter using a switched-capacitor N-path notch filter is shown. N-path filters translate a baseband impedance to RF frequencies realizing RF filters with high selectivity and tunable center frequency. An 8-path switched capacitor filter can be equivalent to a high-Q RLC resonator (where R>1 k Ohm when loaded with 25 Ohm) and can be used directly in interferer reflecting loop 203 to realize a narrowband filtering characteristic that is tunable in some embodiments. The N-path notch filter shown in FIG. 3 can use 4 pF MiM capacitors for capacitors 318, 320, 322, 324, 326, 328, 330, and 332, and 50 µm/65 nm switches with an $R_{ON}$=15 Ohm for switches 302, 304, 306, 308, 310, 312, 314, and 316, in some embodiments.

Figure 4:
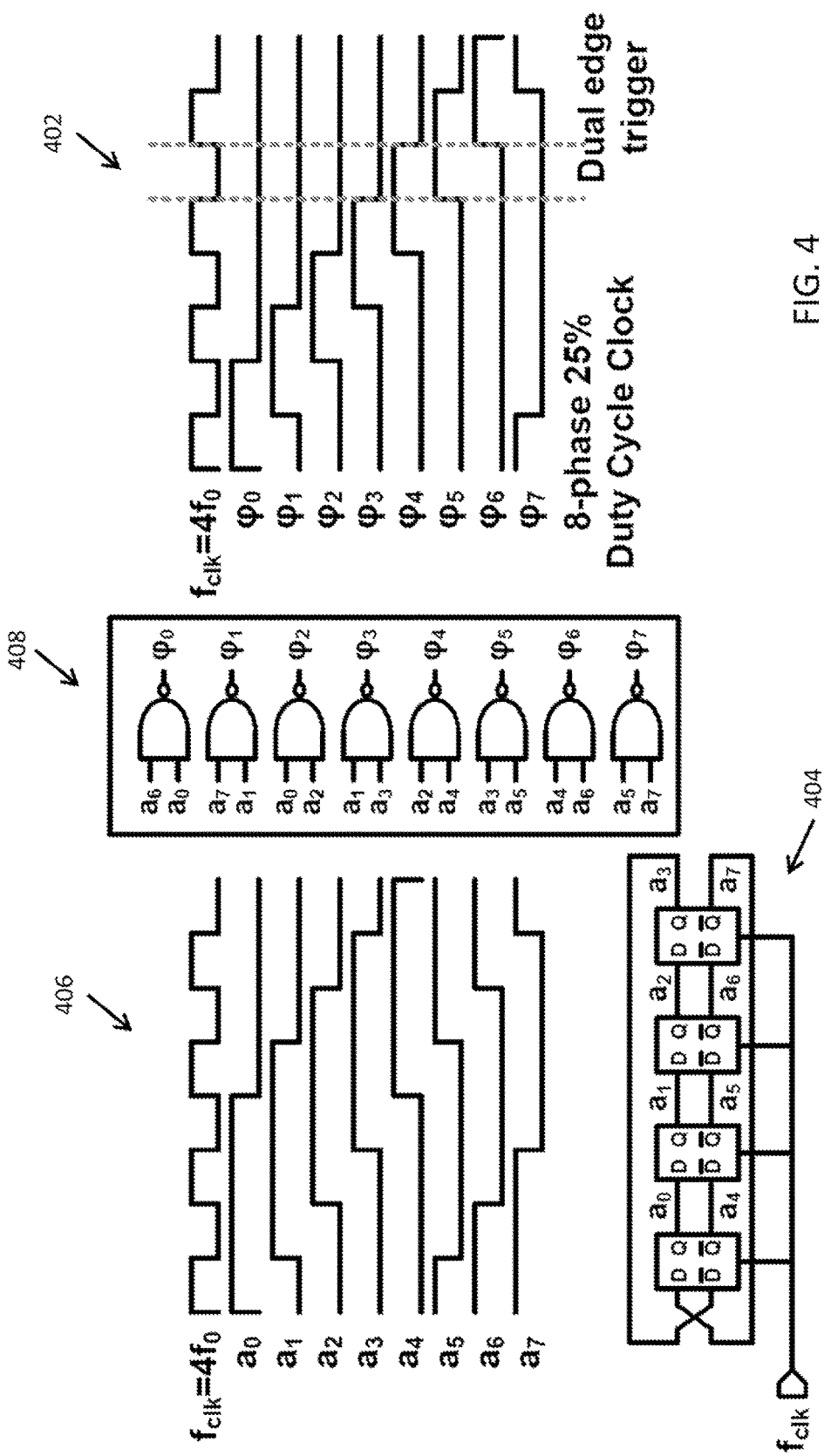
FIG. 4 is a diagram showing timing diagrams of, and circuits for creating, different phases of a clock signal that can be used to control the notch filter of FIG. 3 in accordance with some embodiments.

As shown by timing diagram 402 in FIG. 4, a set of 8-phase 25% duty cycle overlapping clocks can be used to control switches 302, 304, 306, 308, 310, 312, 314, and 316, in some embodiments. The eight capacitors 318, 320, 322, 324, 326, 328, 330, and 332 can be sequentially selected by the overlapping phases of the two switches on either side of each capacitor (e.g., switches 302 and 310 for capacitor 318, and switches 304 and 310 for capacitor 320). The clock signals on the same side of the filter need to be non-overlapping to prevent discharging the capacitors during switch over time.

In some embodiments, as also shown in FIG. 4, to generate clocks $\varphi_0$, $\varphi_1$, $\varphi_2$, $\varphi_3$, $\varphi_4$, $\varphi_5$, $\varphi_6$, and $\varphi_7$, a divide-by-four, dual-edge-triggered latch divider 404 operating at half the frequency of a traditional divide-by-eight divider can be used to generate the signals in timing diagram 406. The clock frequency $f_{clk}$ can be tuned between 0.8 GHz to 6.4 GHz corresponding to a 0.2 GHz to 1.6 GHz frequency tuning range for the frequency $f_0$ of the notch filter, in some embodiments. The signals $a_0$, $a_1$, $a_2$, $a_3$, $a_4$, $a_5$, $a_6$, and $a_7$ produced by divider 404 can then be combined by logic 408 to produce clocks $\varphi_0$, $\varphi_1$, $\varphi_2$, $\varphi_3$, $\varphi_4$, $\varphi_5$, $\varphi_6$, and $\varphi_7$.

Figure 5:
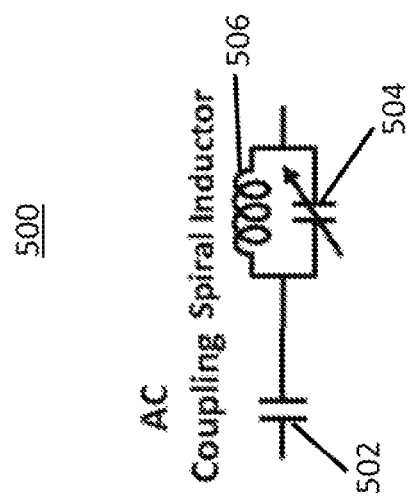
FIG. 5 is a schematic diagram of another notch filter that can be used with the interferer reflecting loop of FIG. 2 in accordance with some embodiments.

FIG. 5 shows an example of a circuit 500 for implementing a notch filter using an LC filter with on-chip switchable capacitors and a spiral inductor. As illustrated, circuit 500 can include an AC coupling capacitor 502, a switchable array of capacitors 504, and a spiral inductor 506 in some embodiments. In some embodiments, the spiral inductor can have any suitable value, such as 1.1 nH, and the switchable array of capacitors can be implemented using any suitable number of parallel-connected, switchable MiM capacitors having any suitable values, such as a value of 4.2 pF to 6 pF.

Figure 6:
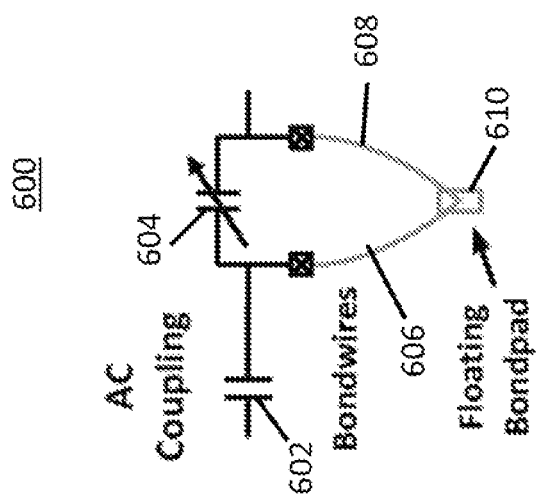
FIG. 6 is a schematic diagram of yet another notch filter that can be used with the interferer reflecting loop of FIG. 2 in accordance with some embodiments.

Turning to FIG. 6, an example of a circuit 600 for implementing a notch filter using an LC filter with on-chip switchable capacitors with bondwires as high Q inductors is shown. As illustrated, circuit 600 can include an AC coupling capacitor 602, a switchable array of capacitors 604, and an inductor formed from bondwires 608 in some embodiments. In some embodiments, the switchable array of capacitors can be implemented using any suitable number of parallel-connected, switchable MiM capacitors having any suitable values, such as a value of 4.2 pF to 6 pF.

Figure 7:
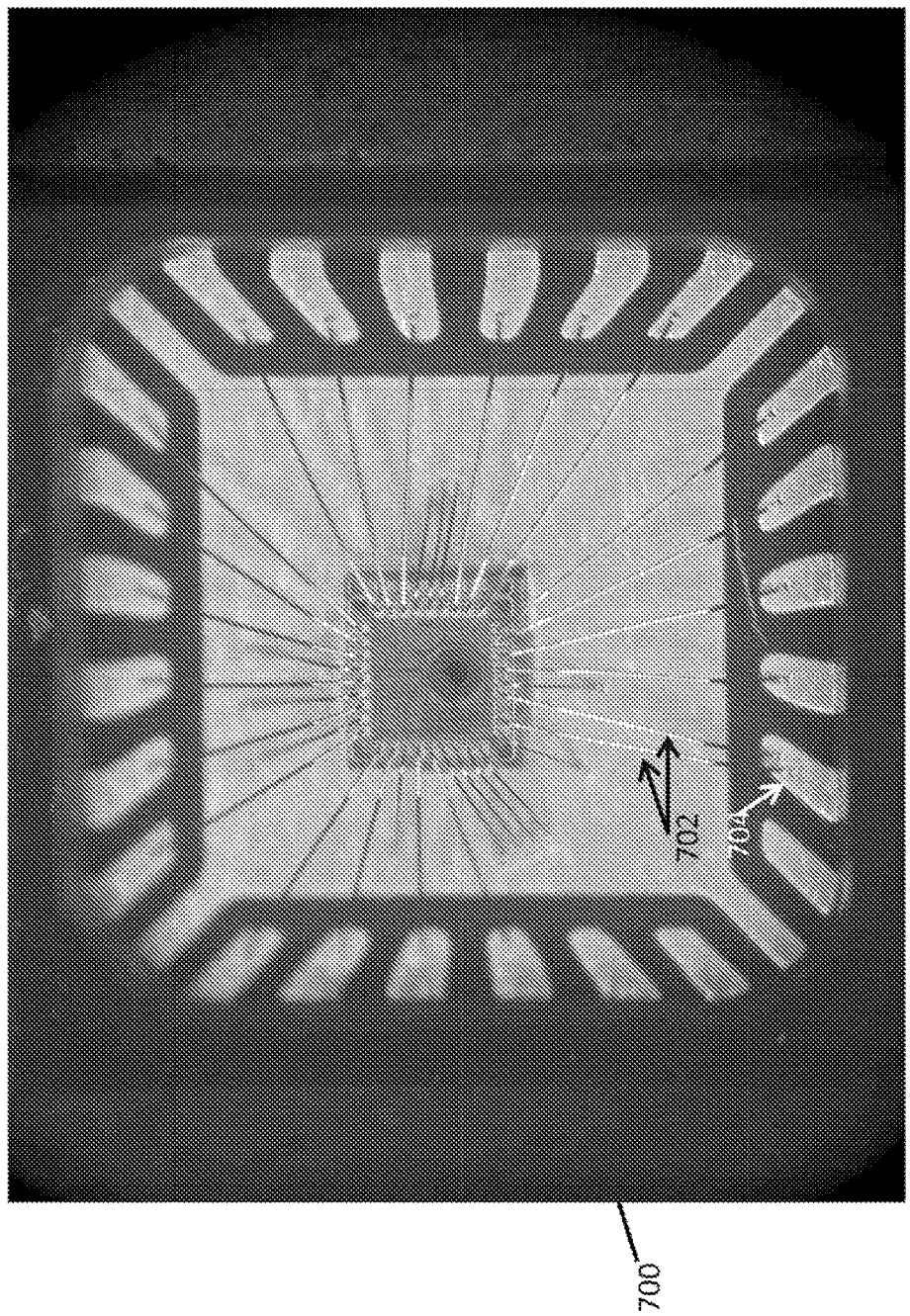
FIG. 7 is an illustration of an example of an approach to implementing an inductor for a QFN package where a floating pin is used as an intermediate landing point for bondwires in accordance with some embodiments.

Bondwires can offer a high Q (e.g., Q>20) alternative to other inductor types to realize an inductor. At packaging time, the wire length of the bondwires can be set to program the frequency of the notch filter, while the on-chip capacitors can be programmed in the field (e.g., from 4.2 pF to 6 pF) for fine tuning. As shown in FIG. 6, the bondwires can be connected to a floating bondpad 610 to provide mechanical support, in some embodiments. FIG. 7 illustrates an example of an approach to implementing an inductor for a QFN package 700 where a floating pin 704 is used as an intermediate landing point for a bondwires 702.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Although the invention has been described and illustrated in the foregoing illustrative embodiments, it is understood that the present disclosure has been made only by way of example, and the numerous changes in the details of implementation of the invention can be made without departing from the spirit and scope of the invention, which is only limited by the claims which follow. Features of the disclosed embodiments can be combined and rearranged in various ways.

What is claimed is:

1. A circuit for a low noise amplifier with an interferer reflecting loop, comprising:
    a low noise amplifier (LNA) having an input and an output, comprising:
        a common gate transconductor having an input coupled to the input of the LNA and an output;
        a common source transconductor having an input coupled to the input of the LNA and an output;
        a first radio frequency trans-impedance amplifier (RF-TIA) having an input coupled to the output of the common gate transconductor and having an output coupled to the output of the LNA; and a second RF-TIA having an input couple to the output of the common source transconductor and having an output coupled to the output of the LNA;
a buffer having an input coupled to the output of the LNA and an output; and
a notch filter having an input coupled to the output of the buffer and an output coupled to the input of the LNA.

2. The circuit of claim 1, wherein LNA is a wideband LNA.

3. The circuit of claim 1, where a gain of the LNA can be changed in the field.

4. The circuit of claim 1, wherein the common source transconductor is a multi-slice common source transconductor.

5. The circuit of claim 4, wherein each slice of the multi-slice common source transconductor is switchable.

6. The circuit of claim 1, wherein the second RF-TIA is a multi-slice RF-TIA.

7. The circuit of claim 6, wherein each slice of the multi-slice RF-TIA is switchable.

8. The circuit of claim 1, wherein a ratio of a contribution of an output signal of the first RF-TIA to an output signal of the second RF-TIA in the output of the LNA is controllable in the field.

9. The circuit of claim 1, wherein the buffer comprises a class-AB complementary source follower.

10. The circuit of claim 1, wherein the notch filter is a switched-capacitor N-path notch filter.

11. The circuit of claim 10, wherein the notch filter comprises:
a first terminal;
a second terminal;
a plurality of capacitors each having a first side and a second side; and
a plurality of switches each having a first side and a second side,
wherein the first side of each of a first half of the plurality of switches are connected to the first terminal, the second side of each of the first half of the plurality of switches are connected to the first side of each of two unique ones of the plurality of capacitors, the first side of each of a second half of the plurality of switches are connected to the second terminal, and the second side of each of the second half of the plurality of switches are connected to the second side of each of two unique ones of the plurality of capacitors.

12. The circuit of claim 11, wherein the plurality of switches are formed from transistors.

13. The circuit of claim 11, wherein a multiphase clock signal controls the plurality of switches.

14. The circuit of claim 13, further comprising a divide-by-four, dual-edge-triggered latch divider and a plurality of NAND gates to create the multiphase clock signal.

15. The circuit of claim 1, wherein the notch filter comprises switchable capacitors and a spiral inductor.

16. The circuit of claim 1, wherein the notch filter comprises switchable capacitors and an inductor formed from bondwires.

17. A circuit for a low noise amplifier with an interferer reflecting loop, comprising:
a low noise amplifier (LNA) having an input and an output;
a buffer having an input coupled to the output of the LNA and an output; and
a notch filter having an input coupled to the output of the buffer and an output coupled to the input of the LNA, wherein the notch filter is a switched-capacitor N-path notch filter comprising:
a first terminal;
a second terminal;
a plurality of capacitors each having a first side and a second side; and
a plurality of switches each having a first side and a second side,
wherein the first side of each of a first half of the plurality of switches are connected to the first terminal, the second side of each of the first half of the plurality of switches are connected to the first side of each of two unique ones of the plurality of capacitors, the first side of each of a second half of the plurality of switches are connected to the second terminal, and the second side of each of the second half of the plurality of switches are connected to the second side of each of two unique ones of the plurality of capacitors.

18. The circuit of claim 17, wherein LNA is a wideband LNA.

19. The circuit of claim 17, where a gain of the LNA can be changed in the field.

20. The circuit of claim 17, wherein:
the LNA comprises:
a common gate transconductor having an input coupled to the input of the LNA and an output;
a common source transconductor having an input coupled to the input of the LNA and an output;
a first radio frequency trans-impedance amplifier (RF-TIA) having an input coupled to the output of the common gate transconductor and having an output coupled to the output of the LNA; and
a second RF-TIA having an input couple to the output of the common source transconductor and having an output coupled to the output of the LNA; and
the common source transconductor is a multi-slice common source transconductor.

21. The circuit of claim 20, wherein each slice of the multi-slice common source transconductor is switchable.

22. The circuit of claim 17, wherein:
the LNA comprises:
a common gate transconductor having an input coupled to the input of the LNA and an output;
a common source transconductor having an input coupled to the input of the LNA and an output;
a first radio frequency trans-impedance amplifier (RF-TIA) having an input coupled to the output of the common gate transconductor and having an output coupled to the output of the LNA; and
a second RF-TIA having an input couple to the output of the common source transconductor and having an output coupled to the output of the LNA; and
the second RF-TIA is a multi-slice RF-TIA.

23. The circuit of claim 22, wherein each slice of the multi-slice RF-TIA is switchable.

24. The circuit of claim 17, wherein:
the LNA comprises:
a common gate transconductor having an input coupled to the input of the LNA and an output;
a common source transconductor having an input coupled to the input of the LNA and an output;
a first radio frequency trans-impedance amplifier (RF-TIA) having an input coupled to the output of the common gate transconductor and having an output coupled to the output of the LNA; and a second RF-TIA having an input couple to the output of the common source transconductor and having an output coupled to the output of the LNA; and a ratio of a contribution of an output signal of the first RF-TIA to an output signal of the second RF-TIA in the output of the LNA is controllable in the field.

25. The circuit of claim 17, wherein the buffer comprises a class-AB complementary source follower.

26. The circuit of claim 17, wherein the plurality of switches are formed from transistors.

27. The circuit of claim 17, wherein a multiphase clock signal controls the plurality of switches.

28. The circuit of claim 27, further comprising a divide-by-four, dual-edge-triggered latch divider and a plurality of NAND gates to create the multiphase clock signal.

29. The circuit of claim 17, wherein the notch filter comprises switchable capacitors and a spiral inductor.

30. The circuit of claim 17, wherein the notch filter comprises switchable capacitors and an inductor formed from bondwires.

* * * * *